United States Patent
Chen et al.

(10) Patent No.: US 6,941,957 B2
(45) Date of Patent: Sep. 13, 2005

(54) METHOD AND APPARATUS FOR PRETREATING A SUBSTRATE PRIOR TO ELECTROPLATING

(75) Inventors: Kuo-Feng Chen, Hsinchu (TW); Hsiu-Mei Yu, Hsin-Chu (TW); Charles Tseng, Taichung (TW); Ta-Yang Lin, Changhua (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/621,252

(22) Filed: Jul. 16, 2003

(65) Prior Publication Data

US 2004/0013804 A1 Jan. 22, 2004

Related U.S. Application Data

(62) Division of application No. 10/045,782, filed on Jan. 12, 2002, now Pat. No. 6,624,060.

(51) Int. Cl.$^7$ ................................................ B08B 3/02
(52) U.S. Cl. .................... 134/102.1; 134/148; 134/153; 134/184; 134/902
(58) Field of Search ................ 156/345.31, 345.23; 118/729, 728; 134/94.1, 102.1, 102.2, 137, 140, 148, 153, 164, 184, 196, 902

(56) References Cited

U.S. PATENT DOCUMENTS

| | | | | |
|---|---|---|---|---|
| 3,461,008 A | * | 8/1969 | Laurie, Jr. | 216/91 |
| 3,880,409 A | * | 4/1975 | Bok et al. | 366/134 |
| 3,970,471 A | * | 7/1976 | Bankes et al. | 134/6 |
| 4,694,527 A | * | 9/1987 | Yoshizawa | 15/308 |
| 4,715,392 A | * | 12/1987 | Abe et al. | 134/62 |
| 4,739,780 A | * | 4/1988 | Czaja et al. | 134/61 |
| 4,850,381 A | * | 7/1989 | Moe et al. | 134/62 |
| 5,158,616 A | * | 10/1992 | Kinoshita et al. | 134/25.4 |
| 5,357,645 A | * | 10/1994 | Onodera | 15/97.1 |
| 5,357,718 A | * | 10/1994 | Kanno | 451/75 |
| 5,579,792 A | * | 12/1996 | Stanasolovich et al. | 134/184 |
| 5,697,391 A | * | 12/1997 | Segawa | 134/102.2 |
| 5,806,544 A | * | 9/1998 | Kosic | 134/68 |
| 5,873,380 A | * | 2/1999 | Kanno | 134/102.1 |
| 5,934,566 A | * | 8/1999 | Kanno et al. | 239/398 |
| 6,085,764 A | * | 7/2000 | Kobayashi et al. | 134/147 |
| 6,119,706 A | * | 9/2000 | Foederl et al. | 134/76 |
| 6,199,567 B1 | * | 3/2001 | Kanno et al. | 134/184 |
| 6,332,470 B1 | * | 12/2001 | Fishkin et al. | 134/102.1 |
| 6,517,999 B1 | * | 2/2003 | Oya et al. | 430/329 |
| 2002/0162579 A1 | * | 11/2002 | Wang et al. | |

FOREIGN PATENT DOCUMENTS

| | | | |
|---|---|---|---|
| DE | 4222272 | * | 2/1993 |
| JP | 56-58999 | * | 5/1981 |
| JP | 62-281430 | * | 12/1987 |
| JP | 63-296392 | * | 12/1988 |
| JP | 3-231427 | * | 10/1991 |
| JP | 3-255629 | * | 11/1991 |
| JP | 5-47738 | * | 2/1993 |
| JP | 5-129268 | * | 5/1993 |
| JP | 6-252120 | * | 9/1994 |
| JP | 10-41267 | * | 2/1998 |

* cited by examiner

Primary Examiner—Frankie L. Stinson
(74) Attorney, Agent, or Firm—Tung & Associates

(57) ABSTRACT

A method including the step of providing a substrate having a contact pad, and an under bump metallurgy overlying the contact pad, and a photoresist layer overlying the under bump metallurgy, and wherein the photoresist layer has an opening defined therein down to the under bump metallurgy and aligned with the contact pad. Pretreating the substrate with the first wetting solution prior to plating a first seed layer over the under bump metallurgy. Thereafter, plating a first seed layer is plated onto the under bump metallurgy.

9 Claims, 4 Drawing Sheets

METHOD AND APPARATUS FOR PRETREATING A SUBSTRATE PRIOR TO ELECTROPLATING

This application is a Divisional of Ser. No. 10/045,782 filed Jan. 12, 2002, now U.S. Pat. No. 6,624,060, has been inserted.

FIELD OF THE INVENTION

This invention relates to a method of making a bump on a substrate, and more particularly, to a method and apparatus for pretreating a substrate prior to electroplating a film over an under bump metallurgy of the substrate.

BACKGROUND OF THE INVENTION

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in the high speed off-chip interconnection.

Flip chips also provide the greatest input/output connection flexibility. Wire bond connections are generally limited to the perimeter of the chip or die, driving the die sizes up a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill. A brief description of the prior art methods of performing the first step will provide a better background for understanding the present invention.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

For a substrate such as a semiconductor wafer having contact pads made from copper based materials, the UBM may include a layer of titanium over the contact pad, and a layer of copper over the titanium layer. Regardless of the type of contact pad used, additional layers may be deposited over the UBM prior to depositing an electrically conductive material such as solder over the UBM and contact pad. These additional layers are often referred to as seed layers. For a copper based contact pad having a UBM including titanium and copper layers, it is known to those skilled in the art to deposit a first seed layer comprising copper over the copper layer of the UBM, and a second seed layer comprising nickel over the copper seed layer.

FIG. 1 illustrates a prior art semiconductor wafer 10 having a base substrate 12 with devices (not shown) formed therein and metal interconnects (not shown) formed over the devices and having a bond pad or contact pad 14 near the upper surface thereof. A passivation layer 16 is provided over the semiconductor wafer and includes an opening therein exposing the upper surface of the contact pad 14. A UBM 18 is provided over and the passivation layer 16 and the contact pad 14. For a copper based contact pad 14 the UBM 18 includes a first seed layer 20, preferably including titanium, overlying the contact pad 14. A second seed layer 22 is provided over the first seed layer 20. Preferably the second seed layer 22 includes nickel. A dry film photoresist layer 24 is provided over the semiconductor wafer and includes an opening 26 formed therein down to the second seed layer 22 and overlying the UBM 18 and contact pad 14. The opening 26 formed in the dry film photoresist 24 may have a depth, as indicated by item A in FIG. 1, of 110 micrometers or greater, and the opening 26 may have a width or diameter, as indicated by item B in FIG. 1, of 100 micrometers for an aspect ratio of approximately 1.

FIG. 2 illustrates a prior art method of depositing a film or seed layer over the UBM on a semiconductor wafer described in FIG. 1. The semiconductor wafer 10 is placed in a wafer jig 28 having an opening therein exposing the upper face of the semiconductor wafer 10. The jig 28 is dipped in a plating solution 30 so that the entire wafer 10 is submerged below the plating solution 30. However, due to the small width of the opening 26 and the aspect ratio, it is difficult to completely plate the entire surface of the exposed portions of the UBM 18 (second layer 22).

It is believed that the surface tension of the plating solution molecules, for example deionized water molecules, prevents the plating solution from adequately filling the opening 26 in the dry film photoresist 24. It is also believed that due to the small width or diameter of the opening 26 (and the associated aspect ratio) air has difficulty flowing out of the opening and is trapped. The trapped air in the opening prevents the plating solution from completely filling the opening 26.

As a result, the plated first seed layer 34 is deposited only over a portion of the second layer 22 of the UBM and does not extend outwardly to meet the side walls 68 of the photoresist 24 that define the opening 26 thus leaving voids 36 as shown in FIG. 4. Thus it would be desirable to provide a method of plating a seed layer over the UBM on a substrate without producing voids in the seed layer.

SUMMARY OF THE INVENTION

A method including the step of providing a substrate having a contact pad, and an under bump metallurgy overlying the contact pad, and a photoresist layer overlying the under bump metallurgy, and wherein the photoresist layer has an opening therein down to the under bump metallurgy and aligned with the contact pad. The substrate is pretreated with the first wetting solution prior to plating a first seed layer over the under bump metallurgy. Thereafter, a first seed layer is plated onto the under bump metallurgy.

In another embodiment of the invention, step of pretreating the substrate includes spraying the substrate with the first wetting solution.

In another embodiment of the invention the step of pretreating the substrate includes spraying the substrate with the first wetting solution so that the sprayed first wetting solution includes particles having a diameter less than the diameter of the opening in the photoresist layer.

In another embodiment of the invention the opening in the photoresist layer has a diameter equal to or less than 100 micrometers and the step of pretreating includes spraying the substrate with the first wetting solution so that the sprayed first wetting solution includes particles having a diameter equal to or less than 100 micrometers.

In another embodiment of the invention the sprayed first wetting solution particles have a diameter ranging from 10–100 micrometers.

Another embodiment of the invention further includes the step of plating a second seed layer over the first seed layer.

In another embodiment of the invention the step of plating a first seed layer over the under bump metallurgy includes dipping the substrate in a plating bath.

In another embodiment of the invention the step of plating a first seed layer over the under bump metallurgy includes dipping the substrate in an electroplating bath.

Another embodiment of the invention includes a step of the pretreating the substrate having a first seed layer thereafter with the second wetting solution prior to plating a second seed layer over the first seed layer, and further comprising plating a second seed layer over the first seed layer.

In another embodiment of the invention the step of the pretreating the substrate having a first seed layer includes spraying the substrate with a second wetting solution so that the sprayed second wetting solution includes particles having a diameter less than the diameter of the opening in the photoresist.

In another embodiment of the invention the opening in the photoresist layer has a diameter equal to or less than 100 micrometers and wherein the step of pretreating the substrate having a first seed layer includes spraying the substrate with a second wetting solution so that the sprayed second wetting solution includes particles having a diameter less than 100 micrometers.

In another embodiment of the invention the sprayed second wetting solution particles have a diameter ranging from 10–100 micrometers.

Another embodiment of the invention further includes a step of depositing an electrically conductive material over the second seed layer.

In another embodiment of the invention the first seed layer includes copper.

In another embodiment of the invention the second seed layer includes nickel.

In another embodiment of the invention the first seed layer includes copper, and the second seed layer includes nickel.

In another embodiment of the invention the under bump metallurgy includes a first and a second layer.

In another embodiment of the invention the first layer of the under bump metallurgy includes titanium, and the second layer of the under bump metallurgy includes copper.

In another embodiment of the invention the first wetting solution includes deionized water.

In another embodiment of the invention the second wetting solution includes deionized water.

Another embodiment of the invention includes an apparatus having a wafer jig constructed and arranged to carry a semiconductor wafer therein and wherein the wafer jig includes an opening therein for exposing a top surface of the semiconductor wafer. A wetting solution supply tank is connected to a pump, and the pump is connected to a spray module for spraying a wetting solution through the spray module and onto a semiconductor wafer carried in the wafer jig.

In another embodiment of the invention the spray module and the wafer jig are constructed and arranged to the movable with respect to each other.

Another embodiment of the invention further includes a wafer jig holding machine constructed and arranged for oscillating reciprocally the wafer jig in at least a vertical direction with respect to the spray module.

In another embodiment of the invention the spray module includes a plurality of spray nozzles each constructed and arranged to spray wetting solution particles each having a diameter less than 100 micrometers.

In another embodiment of the invention the spray module include a plurality of spray nozzles each constructed and arranged to spray wetting solution particles each having a diameter ranging from 10–100 micrometers.

In another embodiment of the invention the spray module includes three spray nozzles arranged in a triangular shape.

These and other objects, features and advantages of the present invention will become apparent from the following brief description of the drawings, detailed description of the preferred embodiments, and appended claims and drawings.

DETAILED DESCRIPTION OF PREFERRED EMBODIMENTS

Figure 1:
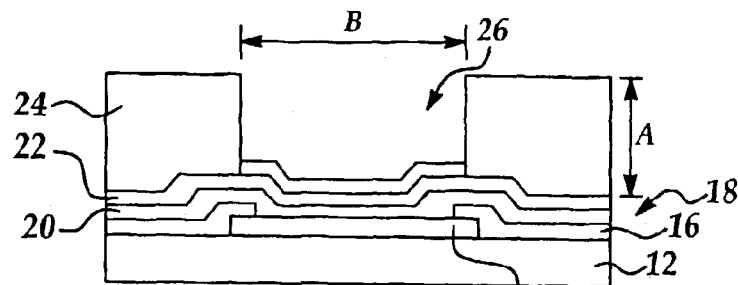
FIG. 1 illustrates a prior art semiconductor wafer having a contact pad and an under bump metallurgy deposited over the contact pad, and a photoresist layer overlying the under bump metallurgy and having an opening therein down to the under bump metallurgy and aligned with contact pad.
Figure 2:
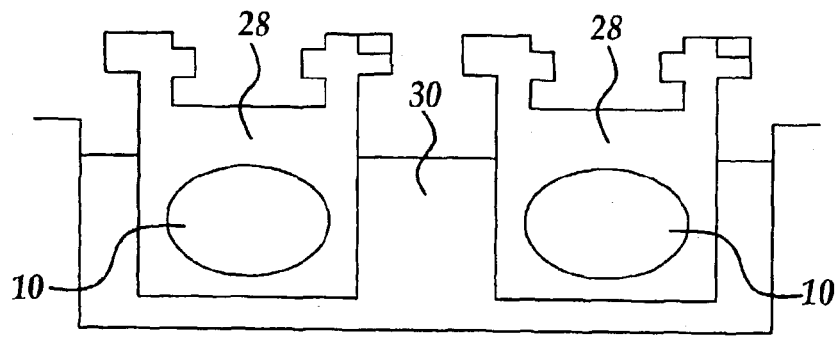
FIG. 2 illustrates a prior art step of dipping a wafer jig carrying a semiconductor wafer into a plating solution.
Figure 3:
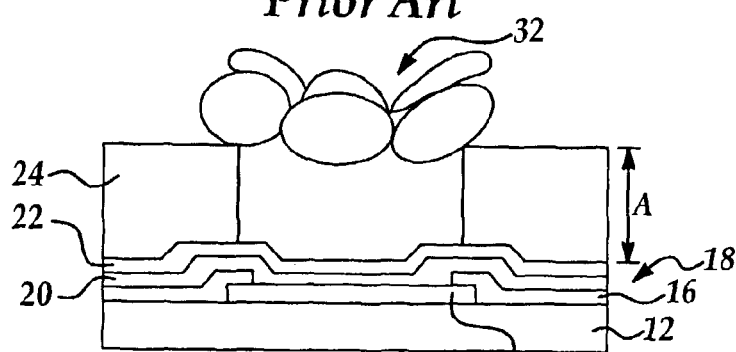
FIG. 3 illustrates the surface tension of plating solution molecules preventing the plating solution from effectively flowing into the opening in the photoresist of the semiconductor wafer in a prior art method as shown in FIG. 1.
Figure 4:
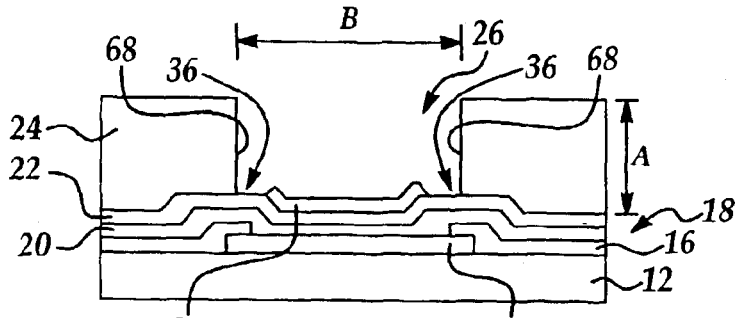
FIG. 4 illustrates the incomplete plating of a first seed layer over the under bump metallurgy of the semiconductor wafer of FIG. 1.
Figure 5:
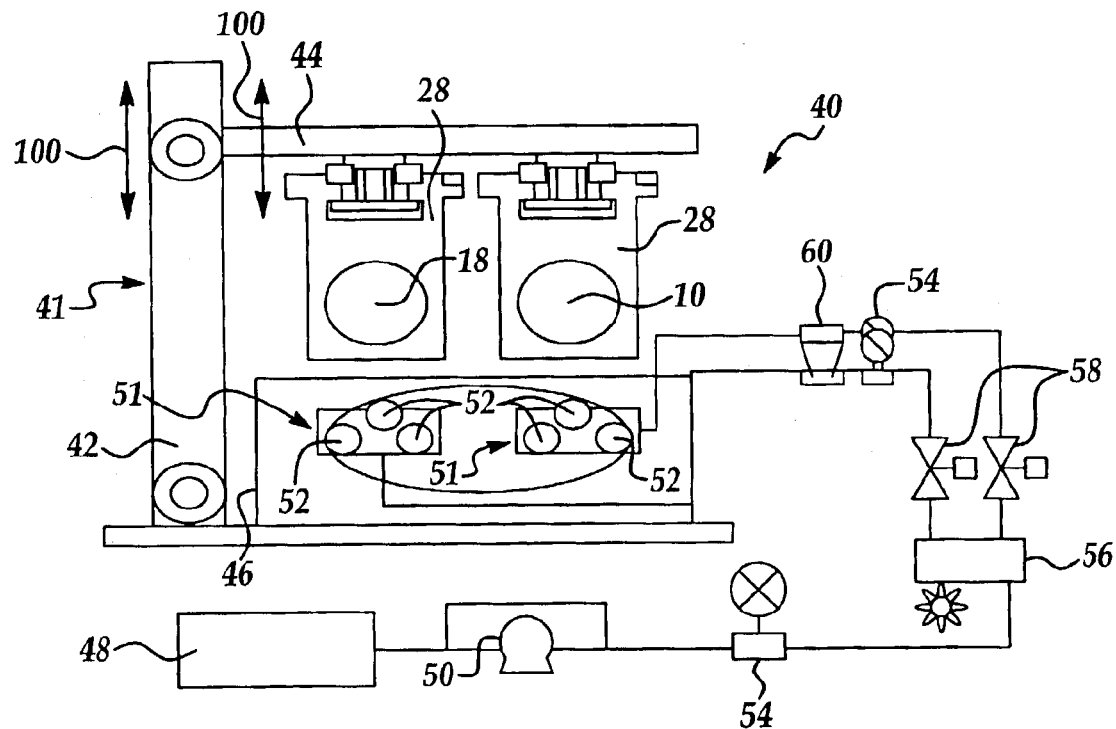
FIG. 5 illustrates an apparatus for carrying out a method of pretreating a semiconductor wafer prior to plating according to the present invention.

FIG. 5 illustrates an apparatus 40 for carrying out a method according to the present invention. The apparatus 40 includes a wafer jig holding machine 41 constructed or arrange for oscillating reciprocally the wafer jig 28 in at least the vertical direction. The wafer jig holding machine 41 includes a vertical stand 42 having a horizontal robot arm 44 connected thereto for slidable movement in a vertical (up-and-down) direction. The horizontal robot arm 44 is constructed and arranged to carrying the wafer jig 28 with the semiconductor wafer 10 mounted therein. An actuator (not shown) is provided to move the horizontal arm 44 in at least the vertical direction. As indicated earlier, the wafer jig 28 includes an opening therein for exposing the top surface of the semiconductor wafer.

A tank 46 may be provided into which the wafer jigs may be lowered. A wetting solution such as deionized water is provided in another tank 48 that is connected to a spray module 51 for each wafer jig 28. Preferably each spray module 51 is positioned inside of the tank 46. Each spray module 51 includes a plurality of sprayers or spray nozzles 52 for spraying the wetting solution (deionized water) onto the exposed surface of the semiconductor wafer 10. Preferably there are three sprayers 52 that are arranged in a triangular like shape. Preferably the sprayers are constructed and arranged to spray the wetting solution so that particles (or droplets) having a diameter less than 100 micrometers, and preferably 10–100 micrometers, are emitted from each spray nozzle 52. The small particles easily flow into the opening 26 formed and the photoresist layer 24. Preferably the wetting solution (deionized water) is sprayed out of each sprayer 52 at a rate of 1.5 kg per cc and at a temperature of at least 90° C. A variety of additional accessory equipment such as pumps 50, regulators 54, pressure switches 56, air valves 58, and flow meters 60 may be positioned between the spray module 51 and the wetting solution supply tank 48 as desired.

Figure 6:
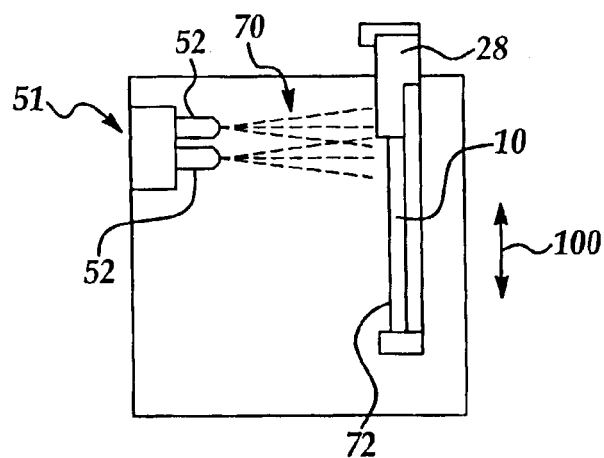
FIG. 6 is a side view illustrating the operation of the apparatus of FIG. 5.

FIG. 6 is a side view of spray module 51 and the individual sprayers 52 spraying the wetting solution 70 onto the top surface 72 of the semiconductor wafer 10 held in the wafer jig. 28 as a wafer jig is moved in at least the vertical direction with respect to the sprayer nozzles 52. The movement of the semiconductor wafer 10 relative to the spray module 51 insures that the entire surface of the semiconductor wafer is covered by the spray and so that the sprayed particles (or droplets) flow into the opening 26 in the photoresist layer 24. Naturally, the spray module 51 can be constructed and arranged to moved relative to the wafer jig 28. Alternatively the wafer jig 28 and the spray module. 51 may remain stationary provided the sprayer nozzles 52 adequately spray the entire surface of the semiconductor wafer and the surfaces of the dry film photoresist 24 and the UBM 18 that define the opening 26 so that in the plating solution flows into the opening 26.

Figure 7:
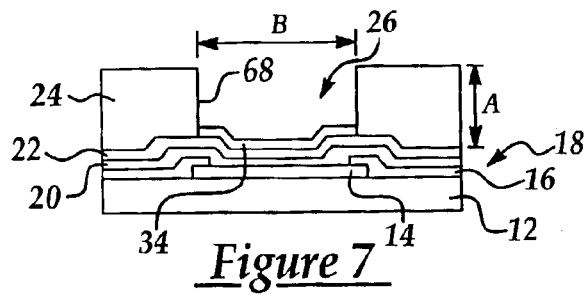
FIG. 7 illustrates a step of the plating a first seed layer over the under bump metallurgy of a semiconductor wafer having been pretreated according to the present invention.
Figure 8:
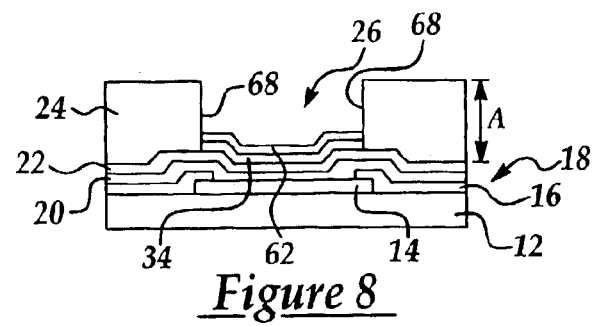
FIG. 8 illustrates the step of plating a second seed layer over the first seed layer of the semiconductor wafer of FIG. 7 according to the present invention.
Figure 9:
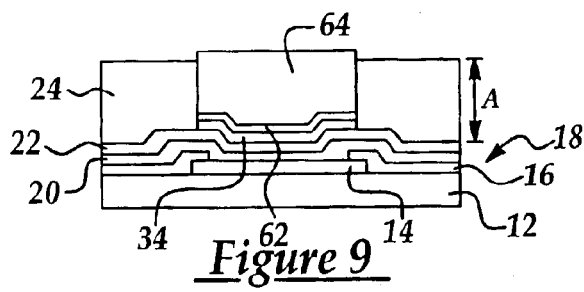
FIG. 9 illustrates the step of depositing an electrically conductive material into the opening in the photoresist layer and over the second seed layer of the semiconductor wafer of FIG. 8 according to the present invention.
Figure 10:
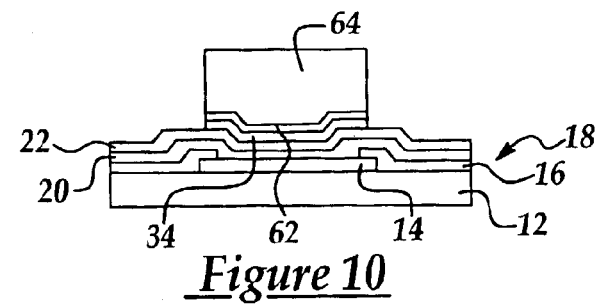
FIG. 10 illustrates the step of removing the photoresist layer according to the present invention.
Figure 11:
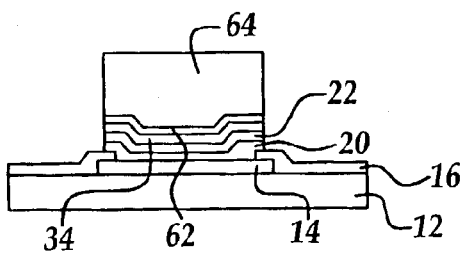
FIG. 11 illustrates the step of removing the excess under bump metallurgy according to the present invention.
Figure 12:
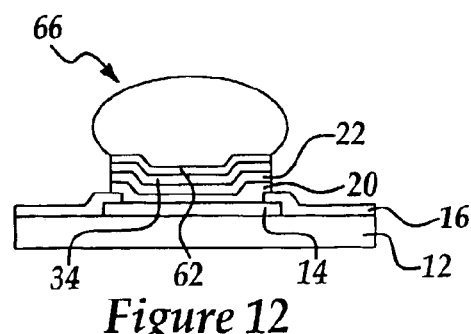
FIG. 12 illustrates a step of reflowing the electrically conductive material to provide a bump on a semiconductor wafer according to the present invention.

After the semiconductor wafer 10 has been pretreated with the wetting solution as described above, the semiconductor jig 28 having a semiconductor wafer 10 therein is dipped in an electroplating bath that includes a solution containing copper so that in a first seed layer 34 is plated over the under bump metallurgy 18. The first seed layer extends to the sides 68 of the photoresist that define the opening 26 to completely cover the exposed surface of the under bump metallurgy 18 without any voids as shown in FIG. 7. Optionally the semiconductor wafer 10, having a first seed layer 34 plated thereon, may be pretreated for a second time by spraying a second wetting solution (deionized water) onto the semiconductor wafer 10 and into the opening 26 in the photoresist 24. Thereafter, the pretreated semiconductor wafer 10 may be dipped in an electroplating bath that includes a solution containing nickel to plate a second seed layer 62 over the first seed layer 34 completely cover in the exposed portions of the first seed layer 34 out to the sides 68 of the photoresist 24 that define the opening 26 as shown in FIG. 8. An electrically conductive material 64 is then deposited into the opening 26 and over the second seed layer 62 as shown in FIG. 9. The electrically conductive material 64 preferably is a solder, for example, a 63 percent by weight tin and 37 percent by weight lead eutectic composition. The electrically conductive material 64 may be deposited by electroplating, electroless plating, screen printing or other suitable means. Thereafter, the photoresist layer 24 is removed by plasma etching or by wet etching as shown in FIG. 10. Then the excess UBM is removed by plasma etching as shown in FIG. 11. Finally, the electrically conductive material 64 is reflown by heating to provide a bump 66 on the semiconductor wafer 10 as shown in FIG. 12.

Figure 13:
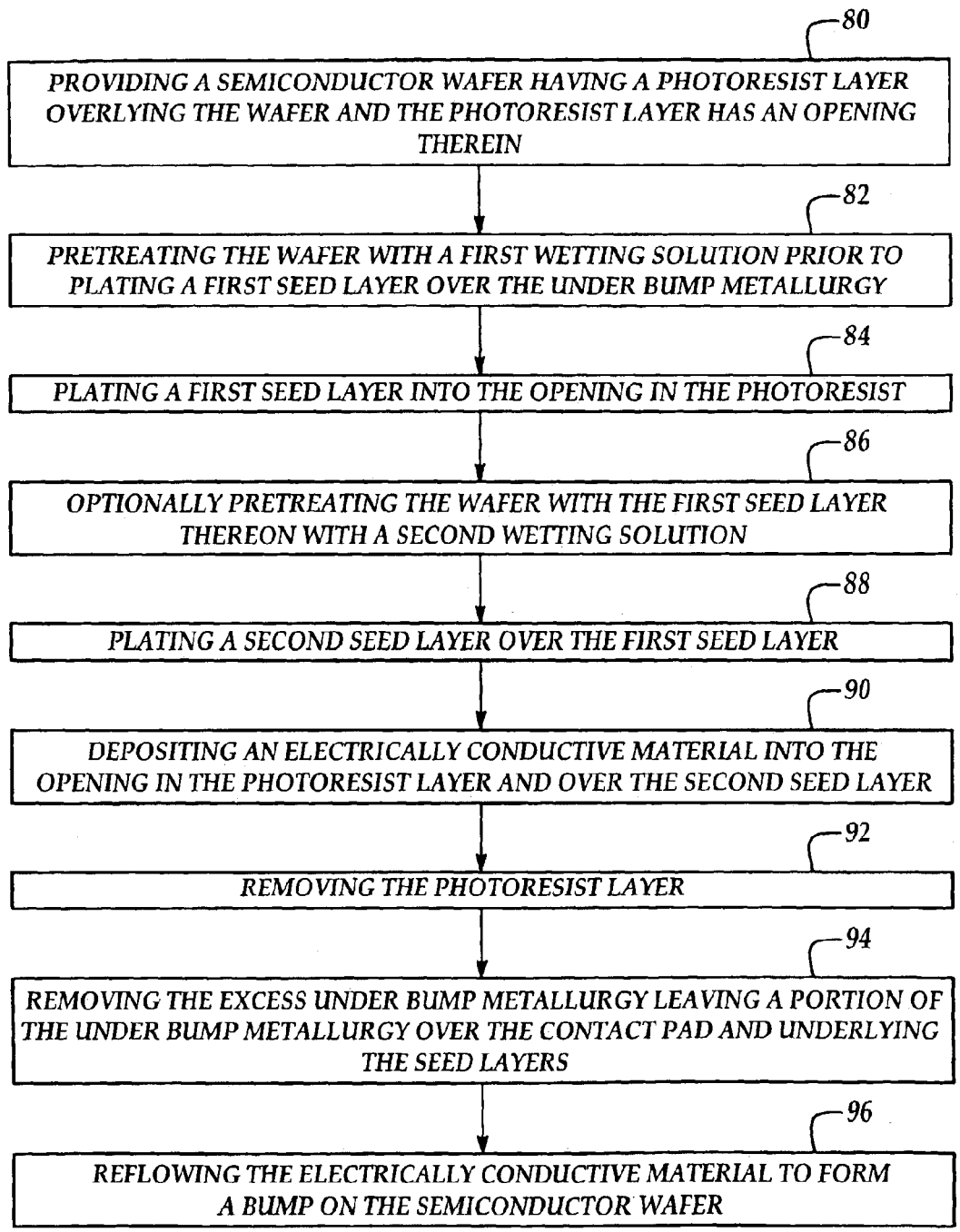
FIG. 13 is schematic illustration of a process of making a bump on a substrate according to the present invention.

Referring to FIG. 13, a method of forming a bump on a substrate according to the present invention may be carried out in the following steps. Providing a semiconductor wafer having a contact pad, and an under bump metallurgy over the contact pad, and the photoresist layer overlying the under bump metallurgy, and wherein the photoresist layer has an opening therein down to the under bump metallurgy and aligned with the contact pad (step 80). Pretreating the wafer with a first wetting solution prior to plating a first seed layer over the under bump metallurgy (step 82). Plating a first seed layer onto the under bump metallurgy (step 84). Optionally pretreating the substrate with the first seed layer thereon with a second wetting solution (step 86). Plating a second seed layer over the first seed layer (step 88). Depositing an electrically conductive material into the opening in the photoresist layer and over the second seed layer (step 90). Removing the photoresist layer (step 92). Removing the excess under bump metallurgy leaving a portion of the under bump metallurgy over the contact pad and underlying the seed layers (step 94). Reflowing the electrically conductive material to form a bump on the semiconductor wafer (step 96).

What is claimed is:

1. A combination comprising:

an apparatus for pretreating a semiconductor wafer prior to electroplating and a semiconductor;

the apparatus comprising a wafer jig constructed and arranged to carry the semiconductor wafer therein, and wherein the wafer jig includes an opening therein for exposing a top surface of the semiconductor wafer, a wetting solution supply tank connected to a pump, and the pump connected to a spray module for pumping wetting solution through a spray module and onto a semiconductor wafer carried in the wafer jig, and wherein the spray module includes a plurality of spray nozzles each constructed and arranged to spray wetting solution particles having a diameter less than 100 micrometers so that the entire top surface of the wafer is covered by the wetting solution and so that the top surface of the wafer covered by the wetting solution may be subsequently electroplated;

the semiconductor wafer comprising a contact pad, and an under bump metallurgy overlying the contact pad, and a photoresist layer overlying the under bump metallurgy, and wherein the photoresist layer has an opening therein down to the under bump metallurgy and aligned with the contact paid and wherein the opening has a diameter less than 100 micrometers and so that the entire top surface of the wafer including the under bump metallurgy is covered by the wetting solution and so that the top surface of the wafer covered by the wetting solution may be subsequently electroplated.

2. A combination as set forth in claim 1 wherein the spray module and the wafer jig are constructed and arranged to be movable with respect to each other.

3. A combination as set forth in claim 1 further comprising wafer jig holding machine constructed and arranged for oscillating reciprocally the wafer jig in at least a vertical direction with respect to the spray module.

4. A combination as set forth in claim 1 further comprising an actuated robot connected to the wafer jig for moving the wafer jig in a vertical direction with respect to the nozzles.

5. A combination as set forth in claim 1 wherein the spray module includes a plurality of spray nozzles each constructed and arranged to spray wetting solution particles having a diameter ranging from 10–100 micrometers.

6. A combination as set forth in claim 1 wherein the spray module includes three spray nozzles arranged in a triangular shape.

7. A combination as set forth in claim 1 constructed and arranged to spray the wetting solution at a rate of 1.5 kg per cc.

8. A combination as set forth in claim 1 wherein the apparatus is constructed and arranged to spray the wetting solution particles having a diameter ranging from 10–100 micrometers.

9. A combination comprising:

an apparatus for pretreating a semiconductor wafer prior to electroplating and a semiconductor;

the apparatus comprising a wafer jig constructed and arranged to carry the semiconductor wafer wherein, and wherein the wafer jig includes an opening therein for exposing a top surface of the semiconductor wafer, a wetting solution supply tank connected to a pump, and the pump connected to a spray module for pumping wetting solution through a spray module and onto a semiconductor wafer carried in the wafer jig, and wherein the spray module includes a plurality of spray nozzles each constructed and arranged to spray wetting solution particles having a diameter less than 100 micrometers;

the semiconductor wafer comprising a contact pad, and an under bump metallurgy overlying the contact pad, and a photoresist layer overlying time under bump metallurgy, and a seed layer overlying time photoresist layer and the under bump metallurgy and wherein the photoresist layer has an opening therein down to the under bump metallurgy and aligned with the contact pad and wherein the opening has a diameter less than 100 micrometers and so that the entire top surface of the wafer including the seed layer is covered by the wetting solution and so that the top surface of the wafer covered by the wetting solution may be subsequently electroplated.

* * * * *